United States Patent
Tomasz et al.

[11] Patent Number: 6,031,878
[45] Date of Patent: Feb. 29, 2000

[54] DIRECT-CONVERSION TUNER INTEGRATED CIRCUIT FOR DIRECT BROADCAST SATELLITE TELEVISION

[75] Inventors: Martin Tomasz, San Francisco, Calif.; James W. H. Marsh, Sherwood, Oreg.

[73] Assignee: Maxim Integrated Products, Inc., Sunnyvale, Calif.

[21] Appl. No.: 08/808,400

[22] Filed: Feb. 28, 1997

[51] Int. Cl.$^7$ .................................................. H04L 25/06
[52] U.S. Cl. ........................... 375/316; 375/345; 455/3.2; 348/731
[58] Field of Search .................................... 375/316, 344, 375/345, 334; 455/205, 234.1, 234.2, 324, 3.2; 348/729, 731

[56] References Cited

U.S. PATENT DOCUMENTS

| | | | |
|---|---|---|---|
| 4,408,351 | 10/1983 | Maurer et al. | 455/260 |
| 4,464,770 | 8/1984 | Maurer et al. | 375/119 |
| 4,476,585 | 10/1984 | Reed | 455/207 |
| 5,003,621 | 3/1991 | Gailus | 455/209 |
| 5,187,809 | 2/1993 | Rich et al. | 455/234.2 |
| 5,325,401 | 6/1994 | Halik et al. . | |
| 5,398,002 | 3/1995 | Bang | 329/302 |
| 5,446,762 | 8/1995 | Ohba et al. | 375/324 |
| 5,448,774 | 9/1995 | Yokozaki et al. | 455/343 |
| 5,521,548 | 5/1996 | Sugawara | 329/306 |
| 5,528,633 | 6/1996 | Halik et al. . | |
| 5,600,672 | 2/1997 | Oshima et al. | 375/219 |
| 5,649,312 | 7/1997 | Kennan | 455/333 |
| 5,745,531 | 4/1998 | Sawahasi et al. | 375/345 |
| 5,790,202 | 8/1998 | Kummer et al. | 348/553 |
| 5,870,439 | 2/1999 | Ben-Efraim et al. | 375/346 |

FOREIGN PATENT DOCUMENTS

WO 96/39745  12/1996  WIPO .

*Primary Examiner*—Temesghen Ghebretinsae
*Attorney, Agent, or Firm*—Blakely, Sokoloff, Taylor & Zafman LLP

[57] ABSTRACT

A converter for the direct down-conversion of direct broadcast satellite signals such as those used for digital television. The direct broadcast satellite signal received from the satellite dish is amplified and then downshifted within the Low Noise Block (LNB), a subsystem contained with the satellite dish assembly, to a predetermined frequency band, typically in the L-band in the range 950 MHz to 2150 MHz. The signal is then sent via a coaxial cable to the set-top box unit located indoors, and there directly converted from the received frequency to baseband, in the preferred embodiment by a single integrated circuit, which may include on chip active filters for further integration and for rejection of adjacent channels and anti-aliasing of analog to digital converters. Use of a wide range variable gain amplifier, generation of closely controlled inphase and quadrature components of the down-converting mixers and offset compensation provides baseband inphase and quadrature components of sufficient quality for data recovery using conventional techniques.

15 Claims, 6 Drawing Sheets

DIRECT-CONVERSION TUNER INTEGRATED CIRCUIT FOR DIRECT BROADCAST SATELLITE TELEVISION

BACKGROUND OF THE INVENTION

1. Field of the Invention

The present invention relates to the field of satellite receivers, and more specifically to satellite to home direct broadcast receiver systems for reception of digitally modulated broadcast information.

2. Prior Art

Digital television is digitally modulated when broadcast over satellite systems using phase shift keyed modulation schemes. The signals are typically received at Ku-band or C-band via a satellite dish antenna. The signals are first amplified and then downshifted to a predetermined frequency band, typically in the L-band, in the range 950 MHz to 2150 MHz. This function is performed within the Low Noise Block (LNB), a subsystem contained with the satellite dish assembly. The signal is then sent via a coaxial cable to the set-top box unit located indoors. In the prior art, the signal received at the set-top box is downshifted to a predetermined intermediate frequency for amplification, bandpass filtering to eliminate adjacent channels and other functions such as automatic gain control, etc., with a subsequent or second down conversion to baseband and recovery of the PSK (phase shift keyed) modulated data.

A specific representative system for reception of the direct broadcast satellite (DBS) signal and extraction of the digital data in the signal is shown in FIG. 1. The signal delivered to the set-top box through cable 20, typically in the frequency range of 950 MHz to 2150 MHz, is amplified through one or more amplifiers 22, 24 and/or 26 and passed through an image filter 28 to an L-band tuner. Typically, gain control is provided in one or more amplifiers amplifying the received signal, such as by way of a variable gain amplifier 24 or a fixed gain amplifier 26 operating into a variable resistive attenuator 30.

The L-band tuner, controlled by external voltage controlled oscillator (VCO) 32, in turn referenced to a crystal controlled phase locked loop 34, downshifts the received signal by mixer 36 to the intermediate frequency, with the signal then passing through a surface acoustic wave (SAW) filter 38 to isolate the channel of interest. This filter is a fixed bandpass filter, the channel falling within the bandpass of the SAW filter being selected by the specific frequency chosen by the oscillator 34 to determine the amount of downshifting to put the desired channel within the bandpass window of the SAW filter.

The output of the SAW filter is then passed to a MAX2101 integrated circuit manufactured by Maxim Integrated Products, Inc., assignee of the present invention. The MAX2101 is controlled by a phase locked loop 40 and tank circuit 42 to mix the output of the SAW filter with in-phase and quadrature components of the output of the tank circuit by mixers 44 and 46 to provide in-phase (I) and quadrature (Q) components of the signal at base band. The I and Q signals are passed through low pass filter 48 and then converted to digital form by analog to digital converters 50 for demodulation by digital signal processor (DSP) 52, which also typically provides an automatic gain control (AGC) signal to control the gain of one or more amplifiers in the system so that the amplitude of the digitized I and Q signals received by the DSP are as expected by the DSP.

Another example of the use of an intermediate frequency may be found in U.S. Pat. No. 5,325,401. The practice of shifting a received frequency band, first to an intermediate frequency for such purposes as further amplification, automatic gain control, station or channel isolation, etc., is an old practice dating back to the early days of radio. It has the advantage of requiring minimal tunable components and of making each channel or station have substantially identical characteristics at both the intermediate frequency and at baseband. However, it has the disadvantage of complexity in the number and nature of components required.

BRIEF SUMMARY OF THE INVENTION

A converter for the direct down-conversion of direct broadcast satellite signals such as those used for digital television. The direct broadcast satellite signal received from the satellite dish is amplified and then downshifted within the Low Noise Block (LNB), a subsystem contained with the satellite dish assembly, to a predetermined frequency band, typically in the L-band in the range 950 MHz to 2150 MHz. The signal is then sent via a coaxial cable to the set-top box unit located indoors, and there directly converted from the received frequency to baseband, in the preferred embodiment by a single integrated circuit, which may include on chip active filters for further integration and for rejection of adjacent channels and anti-aliasing of analog to digital converters. Use of a wide range variable gain amplifier, generation of closely controlled inphase and quadrature components of the down-converting mixers and offset compensation provides baseband inphase and quadrature components of sufficient quality for data recovery using conventional techniques.

Illustrative embodiments are disclosed.

DETAILED DESCRIPTION OF THE INVENTION

In accordance with the present invention, the DBS signal delivered to the set-top box is directly converted from the received frequency to baseband, in the preferred embodiment by a single integrated circuit, so as to eliminate many components required or at least used in prior art systems to obtain and process the signal in intermediate frequency form and then shift to baseband.

Figure 1:
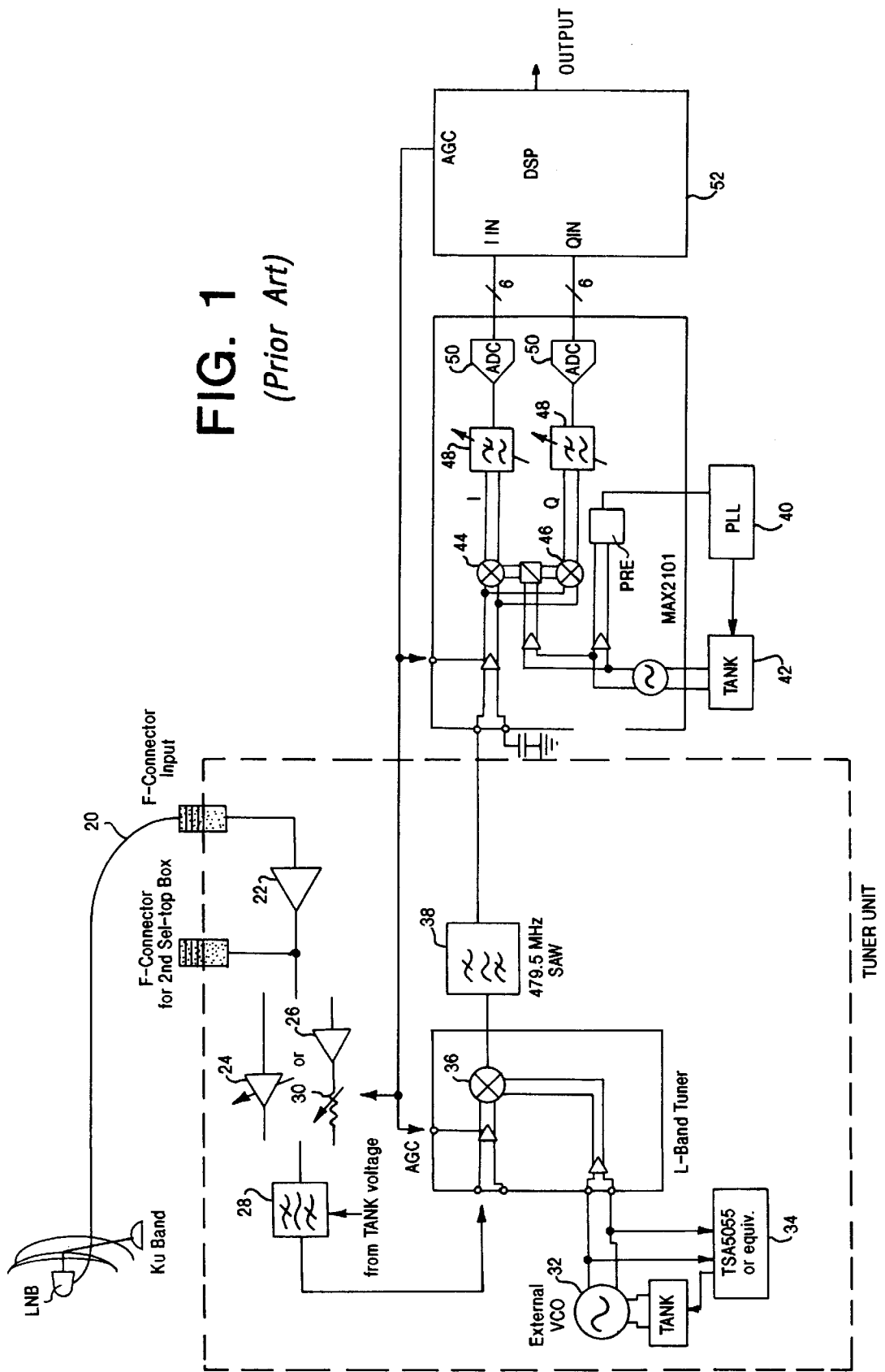
FIG. 1 is a block diagram for a representative prior art system for reception of a direct broadcast satellite (DBS) signal and extraction of the digital data in the signal.
Figure 2:
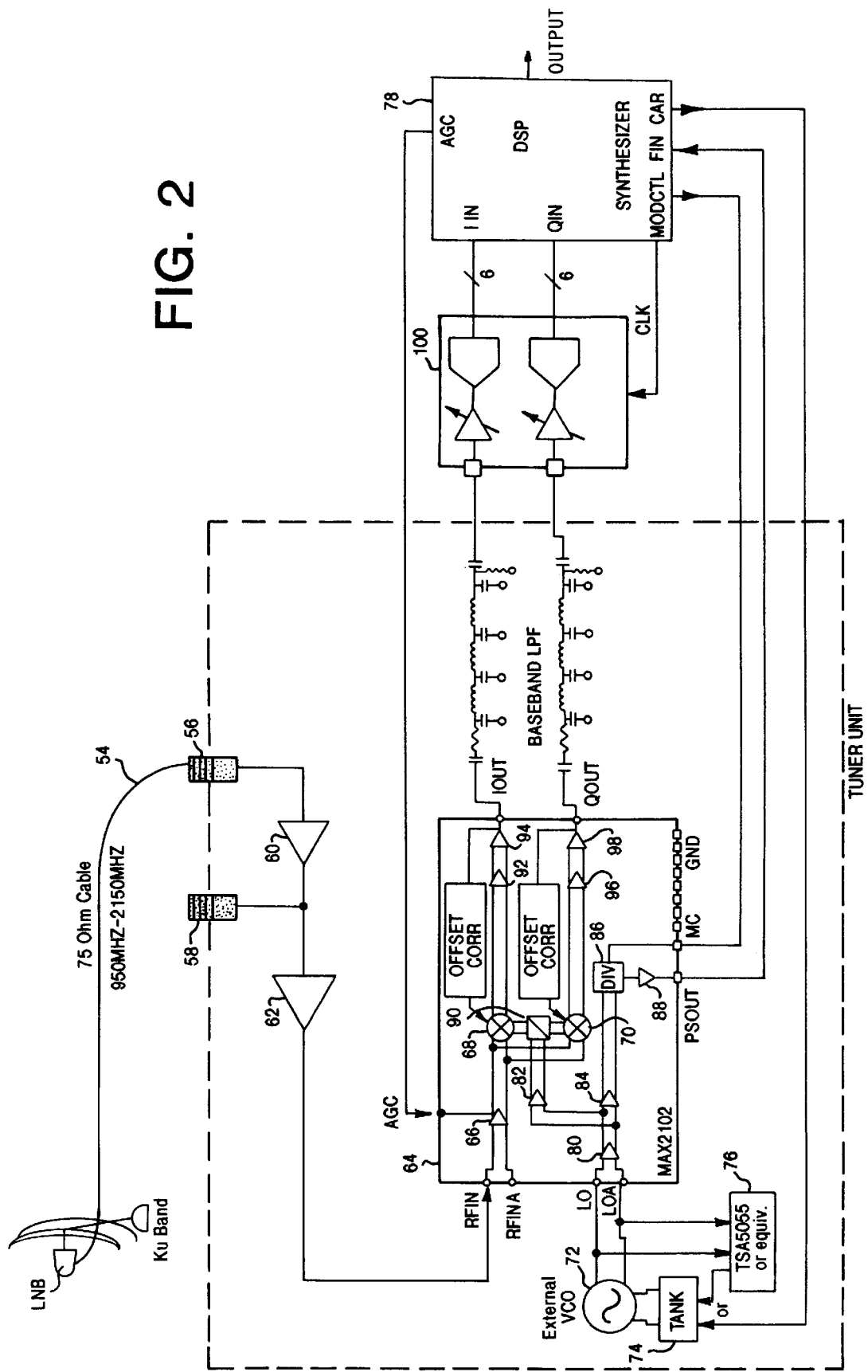
FIG. 2 is a diagram of the preferred embodiment of the present invention.

Now referring to FIG. 2, a diagram of the preferred embodiment of the present invention may be seen. The direct broadcast satellite signal received from the satellite dish is amplified and then downshifted within the Low Noise Block (LNB), a subsystem contained with the satellite dish assembly, to a predetermined frequency band, typically in the L-band in the range 950 MHz to 2150 MHz. The signal is then sent via a 75 ohm coaxial cable 54 to the set-top box unit located indoors. Typically, the tuner unit will have an input connector 56 for receiving the signal on cable 54, and an output connector 58 which may be used for coupling the received signal to a second set top box, if needed. The input connector 56 is typically coupled to the output connector 58 through a buffer or fixed gain amplifier 60, or alternatively may be directly connected thereto if desired. Preferably, further amplification of the signal is provided by an additional amplifier 62, shown in FIG. 2 as a fixed gain amplifier, though the same may be provided with some degree of automatic gain control, either through use of a variable gain amplifier or a variable resistive attenuator coupled to the amplifier.

The signal from the amplifier 62 is coupled to the integrated circuit 64 of the present invention. The integrated circuit includes a variable gain amplifier 66, which amplifier will be more fully described in detail later herein, which provides a wide range of automatic gain control and high linearity to provide acceptably low cross-talk between channels in the output thereof. The output of the amplifier 66 of course is a broadband output, containing in the preferred embodiment, all the channels in the 950 MHz to 2150 MHz DBS signal bandwidth.

The output of amplifier 66 is applied to mixers 68 and 70. The other input to the mixers is derived from an external voltage controlled oscillator (VCO) 72 referenced to inductor-based tank circuit 74. The tank circuit, in turn, may be controlled either by the variable, crystal controlled phase locked loop (PLL) 76, or by a feedback voltage output CAR from the digital signal processor 78. In the case of the use of the crystal controlled phase locked loop (PLL) 76 (such as part number TSA5055 manufactured by Philips, or an equivalent), the output of the VCO is fed back, divided down by the ratio of the expected carrier frequency of the desired channel to the frequency of the crystal oscillator and then compared to the crystal oscillator frequency. The deviation in the external voltage controlled oscillator frequency is used to control the tank circuit to readjust the output frequency of the voltage controlled oscillator.

The output of the mixers will be the sum and the difference frequencies between the received signal and the output of the VCO. The sum frequencies are of course easily filtered out. Because the local selectable frequency oscillator will have selectable frequencies close to the carrier frequency of each of the channels in the received signal, but not identical thereto, the selected channel will generate difference frequencies slightly shifted from the original signal for that channel. The amount of shift is relatively low, however, with the guard bands between channels allowing the signals from adjacent channels to be filtered out by a fixed band, low pass filter. Also, typical DSP demodulation techniques allow recovery of the data, and carrier if desired, when the reference frequency for demodulation is not exactly equal to the modulation.

In the case of control of the tank circuit by the feedback voltage output signal labeled CAR of the digital signal processor 78, the external voltage control oscillator 72 may be controlled to at least on average have the same frequency as the selected channel carrier, and as pointed out before, reasonable deviations in frequency can be tolerated by the DSP demodulator.

In any event, the output of the voltage controlled oscillator 72 is applied to amplifier 80 in the integrated circuit, which in turn is further amplified by amplifiers 82 and 84. The output of amplifier 84 is divided down by divider 86 and buffered by amplifier 88 to be provided as a prescaler output PSOUT, with the dividing ratio being controlled by a mode control signal MODCTL from the digital signal processor 78. The output of amplifier 82, on the other hand, is applied to quadrature generator 90 which generates 0° and 90° (orthogonal) components of the voltage controlled oscillator output, as shall be subsequently described in greater detail. While the design of quadrature generators such as quadrature generator 90 is well known in the prior art, closely controlled performance of the quadrature generator over a very wide band is very important to the successful performance of the present invention. In the preferred embodiment, the quadrature generator (and following amplifiers) is designed to provide less than 0.5 dB of gain mismatch and less than 3° of phase error with respect to the ideal quadrature signal over the entire range of 950 MHz to 2150 MHz.

Figure 3:
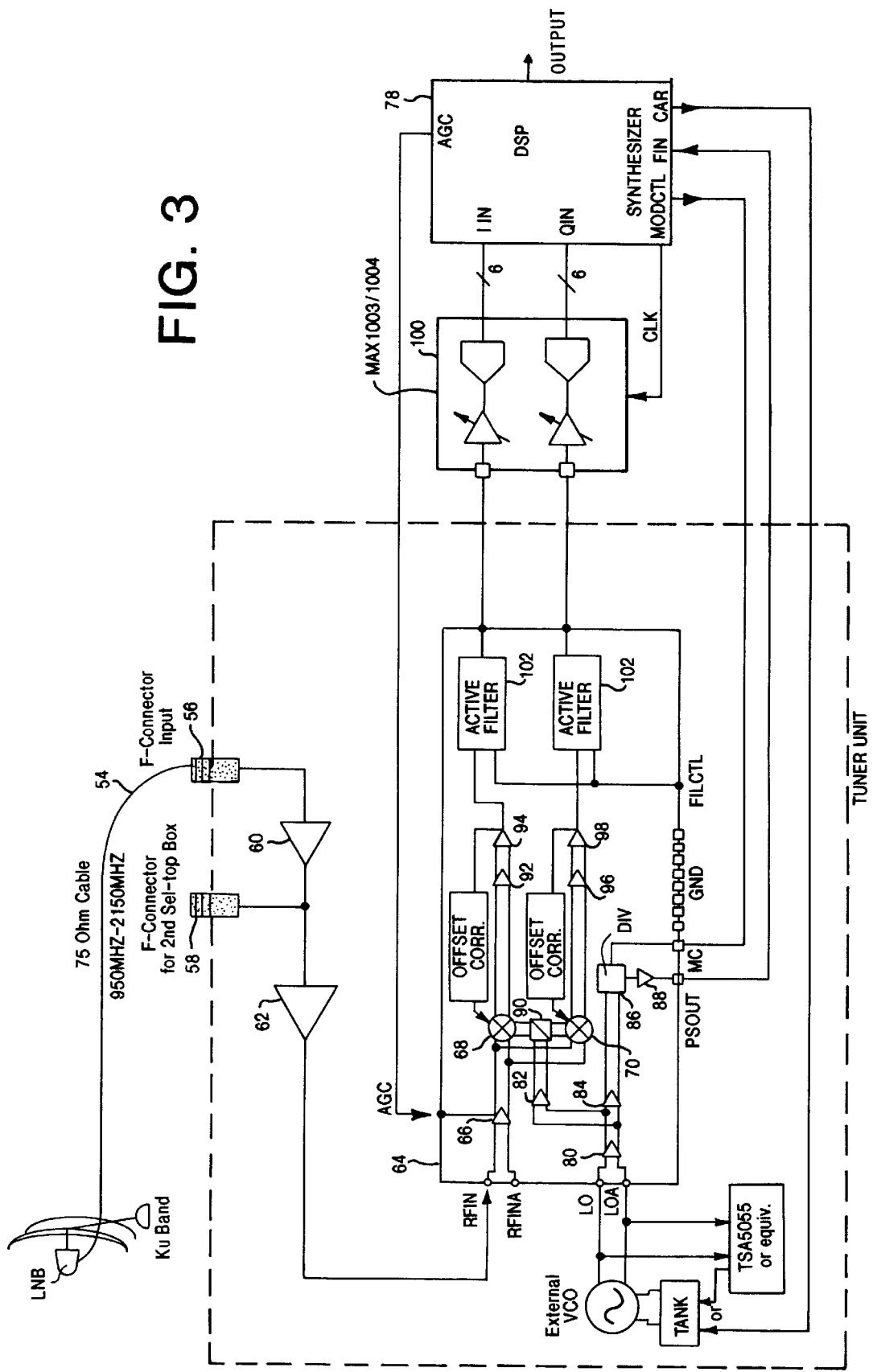
FIG. 3 is an exemplary alternate embodiment illustrating the incorporation of active filters as part of the integrated circuit.

The outputs of mixers 68 and 70 are applied to amplifiers 92 and 94, and 96 and 98 respectively, to provide the baseband output of the circuit. These amplifiers provide additional gain, and in the preferred embodiment are capable of swinging 1.5 volts peak to peak and driving a discrete all pole LC filter with 100 ohms characteristic impedance. As an alternative, these filters may be integrated onto the IC, not as LC filters, but rather as active filters. Aside from eliminating the LC filter, active filters may be controlled so as, by way of example, to have cutoff frequencies in the range of 1 MHz to 45 MHz tunable by external means for the purpose of permitting variable data rate operations. Such an embodiment is shown in FIG. 3, wherein active filters 102 are incorporated as part of the integrated circuit 64 and have a bandpass control FILCTL for external control of the filters.

In a direct conversion to baseband at the frequencies encountered with the present invention, some DC offset will be generated by the down conversion as a result of local oscillator self-conversion. This results from the local oscillator frequency leaking into the RF signal input to the mixers, so that the local oscillator frequency will mix with itself, generating a difference frequency at DC. The level of the local oscillator signal in the RF signal input to the mixers is approximately −50 dBm. The signal present may be as low as −70 dBm, so that if uncorrected, the DC offset may be as high as 20 dBm greater than the signal of interest. In order to avoid saturation of the amplifiers on the output of the mixers, feedback of the DC offset is provided from the amplifier chain to the output of the mixers, as shown in FIGS. 2 and 3. DC offset correction circuitry in general is well known, and need not be described in detail herein. Since the self-conversion may vary with frequency (channel selection), but otherwise will be substantially constant, and at most slowly drifting, the response of the DC offset correction circuitry may be slow, particularly in comparison to the typical data rates to be encountered.

Whether discrete filters or active filters are used, the output of the filters will be digitized by analog to digital converters 100 and then demodulated by the DSP for recovery of the digital data. The analog to digital converters 100 may be, by way of example, MAX 1003/1004 analog to digital converters manufactured by Maxim Integrated Products, Inc., assignee of the present invention. With respect to the DSP and the programming thereof for data recovery, various DSPs may be used and the programming thereof for demodulation and data recovery is well known in the data communications art, and accordingly need not be described in detail herein. In that regard, in the description of the preferred embodiment, the digital signal processor is a special purpose processor, though a specially programmed but general purpose digital processor could be used. Accordingly in the broad context, the phrase digital signal processor or DSP is used to refer to any suitable processor for processing the digital signals at the required rate. In some cases, the dual analog to digital converters 100 may be included on the DSP integrated circuit.

In comparison with the prior art, the present invention allows elimination of a front end image filter, a second frequency conversion or mixer, a SAW filter, a VCO and associated components typical of prior art designs, saving cost and space, and simplifying the radio frequency design. The invention allows filtering of the unwanted adjacent channels to be performed in baseband as described, rather than by way of a SAW filter at an intermediate frequency typical of prior architectures. This enables the use of variable bandwidth active lowpass filtering to accommodate variable data rates, though of course as described, a fixed bandwidth low cost LC discrete filter may be used is desired.

Obviously, it is essential to the usefulness of the present invention that the I and Q components in the received signal be converted to digital form and provided to the DSP for demodulation with the proper amplitude, in spite of normal variations in signal strength, be well matched in amplitude and be as close to 90° out of phase with each other as possible, and that the I and Q components, and thus the output of amplifier 66, have minimum intermodulation components in the output thereof so that the demodulation may proceed with minimum error consistent with the quality of the signal received by the satellite dish. The amplitude balance and the 90° phase shift between the I and Q components is of course determined primarily by the quadrature generator 90 and subsequent amplification, the characteristics of which for the preferred embodiment have already been described. The extent to which the signal will be free of intermodulation components and will be controllable to be of the desired amplitude is determined primarily by amplifier 66. In the preferred embodiment, this amplifier is a low noise, variable gain amplifier, with a gain range of 50 dB, adjustable by the feedback of an automatic gain control signal AGC (see FIGS. 2 and 3) in a range of 1 to 4 volts. This high range of variable gain is much greater than in prior part designs, but is necessary because of the variability in transponder power, dish alignment and 75 ohm cable length. In the preferred embodiment, the amplifier 66 has an input IP3 of +5 dBm at a minimum gain setting. The excellent linearity eliminates the need for discrete varactor-tuned preselection filter, necessary in prior art designs to limit multiple carrier power from generating unwanted intermodulation and triple beat spurious signals in low noise amplifiers/mixers of lesser linearity. Amplifier 66 in the preferred embodiment has a noise figure of 12 dB at maximum gain setting.

Figure 4:
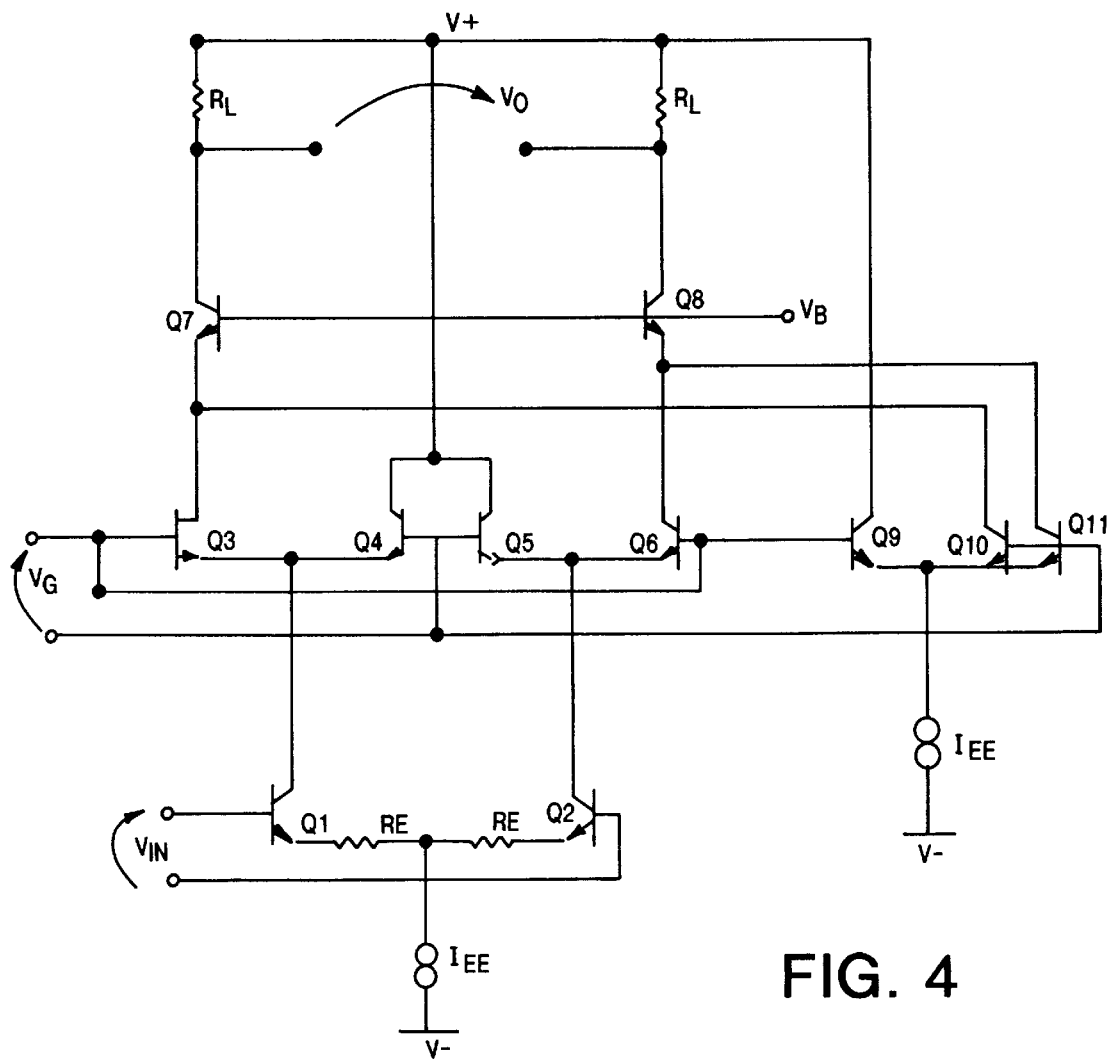
FIG. 4 is a circuit diagram for an exemplary circuit for the variable gain amplifier 66.

In order to achieve the high linearity (low intermodulation), wide automatic gain range desired for amplifier 66 in the preferred embodiment, a special AGC amplifier core is used. The basic circuit for the variable gain amplifier 66 is shown in FIG. 4. The amplifier comprises a $G_m$ (transconductance) stage comprised of transistors Q1 and Q2, emitter resistors $R_E$ and a first current source $I_{EE}$, a current steering stage comprised of transistors Q3 through Q6, a common base connected transistor pair Q7 and Q8, controllable shunting current sources comprising transistors Q9, Q10 and Q11 and another current source $I_{EE}$ adding additional emitter currents to the common base connected transistors Q7 and Q8 and resistors $R_L$. Transistors Q7 and Q8 have their bases biased by a fixed bias voltage $V_B$.

The operation of the circuit of FIG. 4 will of course depend upon the relative transistor sizes. However, consider an example wherein transistors Q3, Q4, Q5, Q6, Q10 and Q11 are identical transistors, and transistor is Q9 is twice the size of those identical transistors. Also consider initially, a zero input voltage $V_{in}$ and a zero gain control voltage $V_g$. Because of the zero differential input voltage $V_{in}$, the current of the first current source $I_{ee}$ will divide equally between the collectors of transistors Q1 and Q2. These components, in turn, will further divide equally between transistors Q3 and Q4, and transistors Q5 and Q6, respectively, so that the collector currents in transistors Q3 and Q6 are each $I_{ee}/4$. With respect to transistors Q9, Q10 and Q11, the current source $I_{ee}$ will divide, with current $I_{ee}/4$ in transistors Q10 and Q11, and because transistor Q9 is twice the size of each of transistors Q10 and Q11, transistor Q9 will have a current $I_{ee}/2$.

Now, by way of example, if the gain control voltage $V_g$ is changed from zero to some value wherein the voltage on the bases of transistors Q3 and Q6 is less than the voltage on the bases of transistors Q4 and Q5, the gain of the amplifier will be reduced, and some of the bias current in transistors Q3 and Q6 will be shifted to transistors Q4 and Q5. At the same time, however, the change of the voltage of the bases of transistors Q3 and Q6 also lowers the base voltage of transistor Q9, reducing the bias current there through and increasing the bias current in transistors Q10 and Q11. The bias current increase in transistors Q10 and Q11 will equal the bias current decrease in transistors Q3 and Q6, so that the bias current in transistors Q7 and Q8 will remain substantially at $I_{ee}/2$, independent of the gain setting for the circuit. Thus, transistors Q7 and Q8 are substantially unaffected by the variation in gain, and more importantly, are not subject to the deleterious affects in circuit performance caused by operation at very low gain values. This substantially improves the linearity of the circuit and the gain control range, providing the low intermodulation and wide gain control range desired with the present invention. In the preferred embodiment, such a VGA provides the majority of the adjustable gain range, with a subsequent stage of amplification supplementing the same to achieve the full range of approximately 50 dB. Of course the specific amplifier circuit shown is by way of example only, as amplifiers of other designs may be used provided the gain control range is compatible with the required performance and the linearity is sufficient to assure data recovery with sufficient accuracy for the application.

Figure 5:
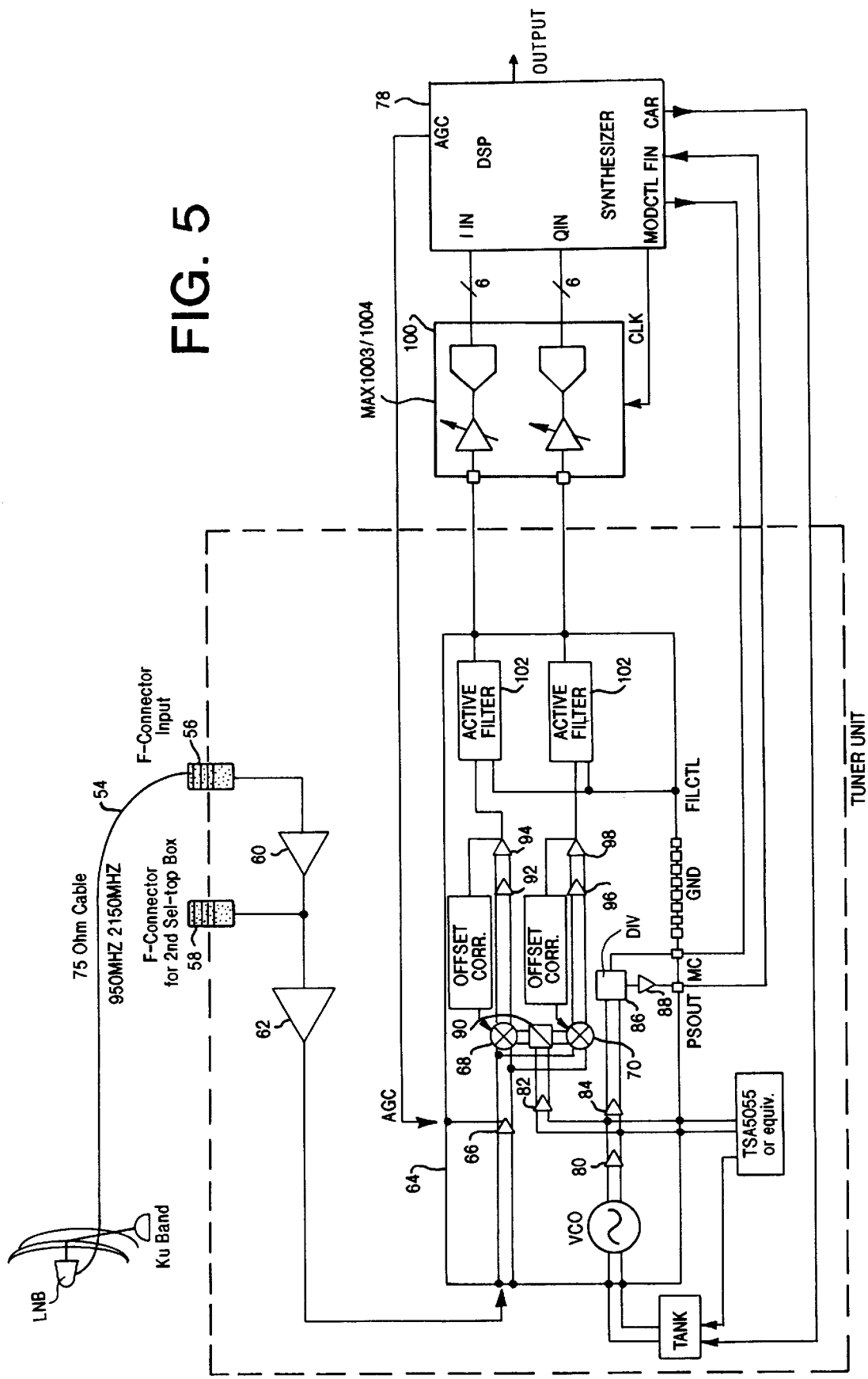
FIG. 5 is a further exemplary embodiment similar to FIG. 3 illustrating the incorporation of VCO as part of the integrated circuit.
Figure 6:
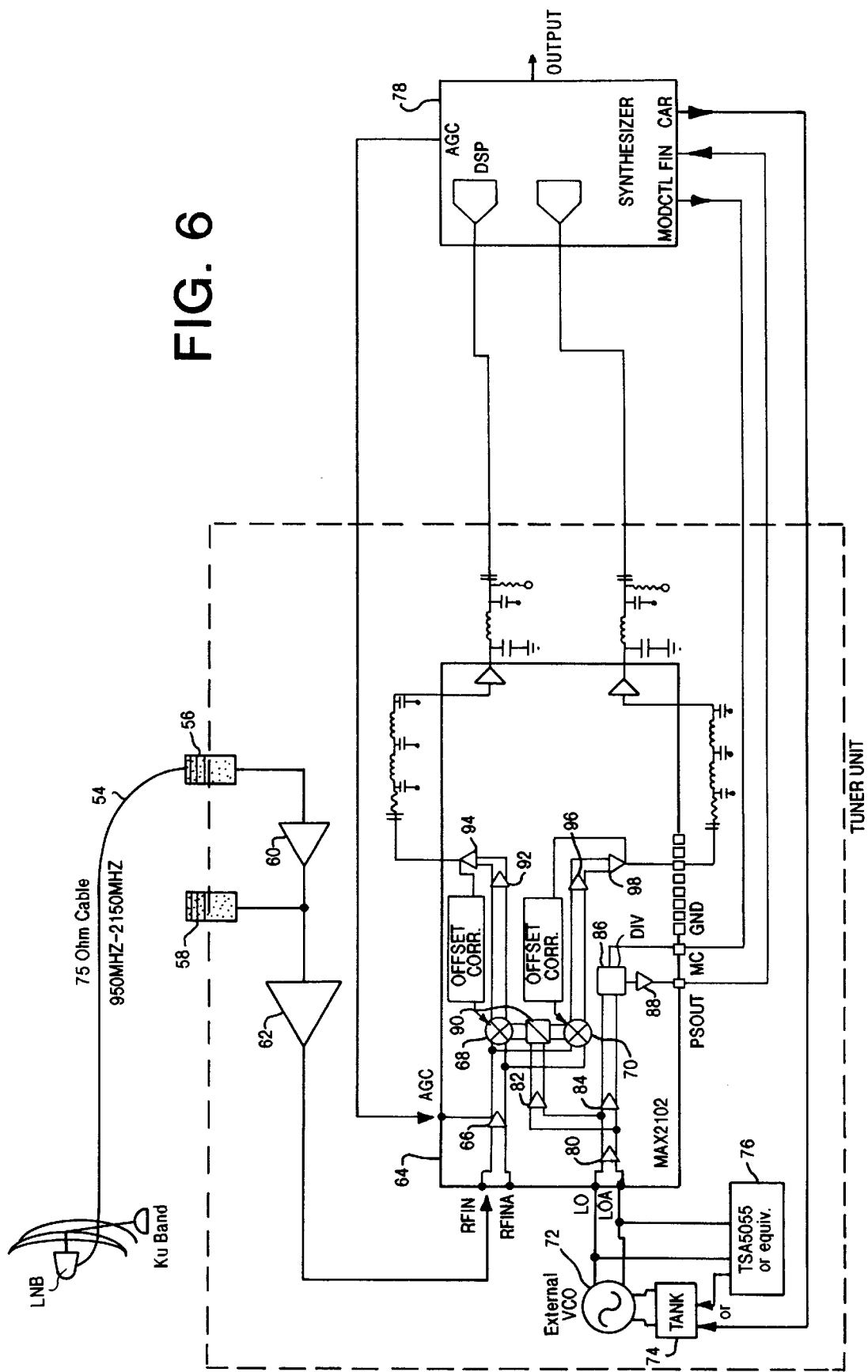
FIG. 6 is a still further exemplary embodiment similar to FIG. 2 illustrating the incorporation of post-filtering amplification as part of the integrated circuit.

In still other alternate embodiments, other functional elements may be included as part of the integrated circuit as desired. By way of example, in the embodiment of FIG. 5, the VCO has been incorporated into the integrated circuit. In the embodiment of FIG. 6, the filtering is done off-chip, though the post filtering amplification is incorporated into the integrated circuit. This embodiment better facilitates the use of conventional analog to digital converters, and further better facilitates the incorporation of the analog to digital converters onto the integrated circuit containing the DSP.

Thus while the present invention has been disclosed and described with respect to certain preferred embodiments thereof, it will be understood by those skilled in the art that the present invention may be varied without departing from the spirit and scope thereof.

What is claimed is:

1. A tuner for direct broadcast satellite applications comprising:

an integrated circuit having:

a variable gain amplifier (VGA) having an amplifier input for coupling to a direct broadcast satellite signal receiving means, a VGA output and a VGA gain control input, the amplifier having a bandwidth for receiving on its input an input signal in a direct broadcast satellite signal frequency range and providing as the VGA output, the input signal amplified with a gain controlled by a gain control signal on the gain control input;

a quadrature generator for receiving an oscillator signal of a frequency approximating the frequency of a carrier in a direct broadcast satellite signal frequency range and generating inphase and quadrature components thereof;

first and second mixers for mixing the VGA output with the inphase and quadrature components from the quadrature generator to provide inphase and quadrature components of the VGA output; and low pass active filters coupled to the inphase and the quadrature components of the output from the mixers; and wherein the low pass range of the active filters is adjustable.

2. A tuner for direct broadcast satellite applications comprising:

an integrated circuit having:

a variable gain amplifier (VGA) having an amplifier input for coupling to a direct broadcast satellite signal receiving means, a VGA output and a VGA gain control input, the amplifier having a bandwidth for receiving on its input an input signal in a direct broadcast satellite signal frequency range and providing as the VGA output, the input signal amplified with a gain controlled by a gain control signal on the gain control input;

a quadrature generator for receiving an oscillator signal of a frequency approximating the frequency of a carrier in a direct broadcast satellite signal frequency range and generating inphase and quadrature components thereof;

first and second mixers for mixing the VGA output with the inphase and quadrature components from the quadrature generator to provide inphase and quadrature components of the VGA output; and a frequency divider coupled to the input to the quadrature generator and having its output coupled to an integrated circuit terminal for coupling the divider output to a circuit off the integrated circuit.

3. A tuner for direct broadcast satellite applications comprising:

an integrated circuit having:

a variable gain amplifier (VGA) having an amplifier input for coupling to a direct broadcast satellite signal receiving means, a VGA output and a VGA gain control input, the amplifier having a bandwidth for receiving on its input an input signal in a direct broadcast satellite signal frequency range and providing as the VGA output, the input signal amplified with a gain controlled by a gain control signal on the gain control input;

a quadrature generator for receiving an oscillator signal of a frequency approximating the frequency of a carrier in a direct broadcast satellite signal frequency range and generating inphase and quadrature components thereof;

first and second mixers for mixing the VGA output with the inphase and quadrature components from the quadrature generator to provide inphase and quadrature components of the VGA output; and a frequency divider coupled to the input to the quadrature generator and having its output coupled to an integrated circuit terminal for coupling the divider output to a circuit off the integrated circuit.

4. The tuner of claim 3 wherein the frequency divider is a variable frequency divider having a mode control input thereto, the mode control input being coupled to a terminal on the integrated circuit for receiving a mode control signal from off the integrated circuit.

5. A tuner and data recovery system for direct broadcast satellite applications comprising:

an oscillator providing any of a plurality of selectable frequencies, each selectable frequency approximating the frequency of a carrier in a direct broadcast satellite signal frequency range;

an integrated circuit having:

a variable gain amplifier (VGA) having an amplifier input for coupling to a direct broadcast satellite signal receiving means, a VGA output and a VGA gain control input, the amplifier having a bandwidth for receiving on its input an input signal in a direct broadcast satellite signal frequency range and providing as the VGA output, the input signal amplified with a gain controlled by a gain control signal on the gain control input;

a phase generator for receiving the oscillator signal and generating inphase and quadrature components thereof; and, first and second mixers for mixing the VGA output with the inphase and quadrature components from the phase generator to provide as mixer outputs, inphase and quadrature components of the VGA output;

a low pass filter coupled to each of the mixer outputs to filter out signals other than those associated with the carrier having a frequency approximately equal to the oscillator frequency;

an analog to digital converter coupled to each of the low pass filters to digitize the outputs thereof; and, a digital signal processor coupled to the analog to digital converters to recover digital data modulated on the carrier passing the low pass filters.

6. The tuner and data recovery system of claim 5 wherein the digital signal processor provides the gain control input to the integrated circuit.

7. The tuner and data recovery system of claim 5 wherein the integrated circuit further includes amplifiers coupled to the mixers for amplifying the inphase and the quadrature components of the VGA output from the mixers, the filters being coupled to outputs of the amplifiers.

8. The tuner and data recovery system of claim 5 wherein the low pass filters are low pass active filters which are also on the integrated circuit.

9. The tuner and data recovery system of claim 8 wherein the band pass range of the active filters is adjustable.

10. The tuner and data recovery system of claim 5 wherein the integrated circuit further includes a frequency divider coupled to the input to the phase generator and having its output coupled to an integrated circuit terminal for coupling the divider output to a circuit off the integrated circuit.

11. The tuner and data recovery system of claim 10 wherein the frequency divider is a variable frequency divider having a mode control input thereto, the mode control input being coupled to a terminal on the integrated circuit for receiving a mode control signal from off the integrated circuit.

12. The tuner and data recovery system of claim 5 wherein the oscillator comprises an oscillator having a plurality of selectable frequencies.

13. The tuner and data recovery system of claim 5 wherein the digital signal processor is programmed to recover the selected carrier frequency, the oscillator being controlled by the digital signal processor to provide a selectable frequency responsive to the recovered frequency.

14. The tuner of claim 5 further comprising a broadband voltage controlled oscillator tunable from 950 to 2150 MHz.

15. The tuner of claim 14 further comprising an external varactor and inductor-based tank circuit.

* * * * *